United States Patent [19]

Bolt

[11] Patent Number: 5,285,895
[45] Date of Patent: Feb. 15, 1994

[54] CONTAINER FOR INTEGRATED CIRCUIT BOARD

[76] Inventor: William S. Bolt, 30W311 Army Trail Rd., Bartlett, Ill. 60103

[21] Appl. No.: 974,289

[22] Filed: Nov. 10, 1992

Related U.S. Application Data

[63] Continuation-in-part of Ser. No. 785,556, Oct. 31, 1991, abandoned.

[51] Int. Cl.⁵ ............................................. B65D 85/30
[52] U.S. Cl. ..................... 206/334; 206/328; 206/459; 206/509; 206/511; 220/345; 361/800
[58] Field of Search ............... 206/328, 334, 449, 454, 206/511, 509; 220/345; 361/415; 364/708

[56] References Cited

U.S. PATENT DOCUMENTS

| | | | |
|---|---|---|---|
| 2,532,083 | 11/1950 | Brenner | 220/345 X |
| 3,180,697 | 4/1965 | Mulch | 220/345 X |
| 3,706,486 | 9/1973 | Rifkin et al. | 206/334 X |
| 4,406,362 | 9/1983 | Thomas et al. | 220/346 X |
| 4,506,785 | 3/1985 | Seefeldt | 206/334 |
| 4,702,535 | 10/1987 | Beun | 361/415 X |
| 4,763,782 | 8/1988 | Sinchok | 206/334 X |
| 4,886,163 | 12/1989 | Hubbell et al. | 206/334 |
| 4,924,355 | 5/1990 | Mitchell et al. | 361/415 |
| 5,076,619 | 12/1991 | Chi | 364/708 X |
| 5,117,378 | 5/1992 | Ho | 369/708 |

*Primary Examiner*—Bryon P. Gehman
*Attorney, Agent, or Firm*—Mathew R. P. Perrone, Jr.

[57] ABSTRACT

The container is a capable, hollow rectangular container having an open small end. Various supports for the printed circuit board combine to maintain a chosen position of the integrated circuit board in the container. The container is stackable and crushproof, while protecting an enclosed circuit board from physical or electrostatic damage.

18 Claims, 6 Drawing Sheets

CONTAINER FOR INTEGRATED CIRCUIT BOARD

CROSS REFERENCE TO RELATED APPLICATION

This application is a continuation-in-part of U.S. patent application Ser. No. 07/785,556; filed Oct. 31, 1991, now abandoned by the same inventive entity.

This invention relates to a container for an integrated circuit board, and more particularly to a container and method for forming the container which is storable and transportable while protecting the integrated circuit board.

BACKGROUND OF THE INVENTION

Integrated circuit boards are part and parcel of daily life. There is a special class of integrated circuit boards used in the United States by telephone companies. Such boards are an integral part of the great efficiency of any telephone system, especially the United States telephone system. These specialized boards are used in great numbers and have a particular structure. The integrated circuit board includes a platform and an end piece secured in a perpendicular manner to the platform. The platform carries the desired circuit. The end piece serves a carrying, inserting, removing or other function for the printed circuit board. Furthermore, the end piece assists in the placing of the printed circuit board into the desired circuit.

It is highly desirable to transport these boards in an efficient and effective manner. It is also desirable to store these boards efficiently, while making them easily retrievable and accessible. The prior art shows several containers for use in transporting the circuit boards. These prior art containers for an integrated circuit board lack the easy readability required for easy recovery from storage.

Such a container also lacks the ability to withstand the rough physical and electrostatic conditions inherent in transporting of the integrated circuit board. Both the physical and electrostatic transporting conditions can damage the board and prevent proper operation of the board when the final destination is reached. Typical of a physical problem is a cracked or otherwise damaged board. A typical electrostatic problem occurs when an electrostatic charge causes damage to a board component. This electrostatic charge may render the board completely inoperative or cause a substandard performance of the board. The container must, therefore, provide protection against both the physical and electrostatic problems or conditions.

Also it is desirable to have the containers for integrated circuit boards be of the stacking or nesting type. If the containers for the integrated circuit boards stack or nest, the container and the board therein are both easier to transport and easier to store upon receipt; especially for a great quantity thereof. Yet providing stacking or nesting capabilities interferes with the determination and cataloging of the various boards that are received.

Important also is determination of the appropriate type of material for construction of the container and what type of construction can be used to efficiently form the container. Additionally, it must be determined what type of special requirement such as antistatic, conductive, non-conductive or other shielding is required. A further determination requires the consideration of temperature limits, to which the container and the board will be exposed.

Other custom features may be needed in the container. These features can include, in addition to stacking or nesting, storage and various sizes of the container. The options of storing and transporting must include easy adaptability to various covers, rings or handles encountered in the use or storage of the integrated circuit board. This great plurality of requirements for the device clearly complicates selecting the appropriate parameters and maximizing the advantage of each parameter.

Various points are needed to support an integrated circuit board in a container. It is difficult to form all of the required supports. Even if the container is made in two parts, it is difficult to efficiently join and seal the two parts together.

Clearly, it is desired to provide a container which can protect the circuit board in transport. This container must be resistant to difficult physical handling and must protect the integrated circuit board from various electrostatic charges. With such a container, the desired protection of the printed circuit board can be obtained.

SUMMARY OF THE INVENTION

Accordingly, among the many objectives of this invention, is to provide a suitable container permitting efficient protection, transportation, and storage of an integrated circuit board.

A further objective of this invention is to provide an easily stored container for an integrated circuit board.

A still further objective of this invention is to provide a container for an integrated circuit board, which permits the board to be easily identified.

Yet a further objective of this invention is to provide a container for an integrated circuit board, which permits physical protection of the board.

Also an objective of this invention is to provide a container for an integrated circuit board, which permits electrostatic protection of the board.

Another objective of this invention is to provide a container for an integrated circuit board, which permits storage of the board.

Still another objective of this invention is to provide a container for an integrated circuit board, which permits retrieval of the board.

Yet another another objective of this invention is to provide a container for an integrated circuit board, which permits stacking of a plurality of containers for integrated circuit boards.

A further objective of this invention is to provide a method for forming an easily stored container for an integrated circuit board.

A still further objective of this invention is to provide a method for joining parts to form container for an integrated circuit board.

These and other objectives of this invention (which other objectives become clear by considering the specification, claims and drawings as a whole) are met by providing a container for an integrated circuit board capable of physically and electrostatically protecting the integrated circuit board. The container is a hollow rectangular container having an open small end. Various supports for the printed circuit board combine to maintain a chosen position of the integrated circuit board in the container.

BRIEF DESCRIPTION OF DRAWINGS

Throughout the figures of the drawing where the same part appears in more than one figure of the drawing, the same number is applied thereto.

DESCRIPTION OF THE PREFERRED EMBODIMENTS

A container for an integrated circuit board is an open-ended rectangular box, which can receive therein an integrated circuit board, especially of the type desired to be used by a telephone company. A manufacturer of these integrated circuit boards may also use these container. Other uses are also possible for the container.

The particular structure of the container is adaptable for the various sizes of circuit boards. A mold or other container manufacturing device can be easily adjusted or manufactured to make the various size containers. As above described the telephone company board has a circuit platform and an end piece perpendicular thereto. The end piece generally contains a coding mechanism for telling the installer or user, what kind of board it is in a quick and efficient manner. The lock mechanism standardly present on the integrated circuit board cooperates with the clip receiver of the container to secure the printed circuit board in the case.

The material used to make the container can be adapted to meet any desired fire rating, electrostatic resistance and other requirements. The material may be transparent, translucent, opaque or combination thereof, with any desired color or colors applied thereto. Clearly appropriate plastic or synthetic resin materials may be used.

The open ended rectangular container described herein includes sufficient protection for the board while at the same time providing a receiver which engages the standard locking mechanism on the board to hold the board in the container. With the end plate providing protection for the board from that end, the integration of the end plate with the container, achieves the desired protection due to the resulting closed rectangle.

A stable and stackable crush proof container for holding an integrated circuit board can be achieved. Basically, the container includes a base and a top which are welded or otherwise secured together. The base has a series of pins along the outer edge thereof which are received by a series of pin apertures in the top. After the pins are inserted through the apertures, a fusion is done to secure the top thereto. A cap can then be used to close the container completely and seal the board in the container.

Around the edge of the top is a raised top rib slightly interior to the edge of the top. A cross-section of the top rib shows a hollow U-shape. The rib basically frames the top of the top with a slight outside ledge. The ledge contains the apertures for receiving the base pins to assist in securing the base thereto.

Around the edge of the base is a raised base rib slightly interior to the edge of the base. The base rib basically frames the edge of the base adjacent to the top with a slight pin ledge extending outwardly therefrom. The pin ledge contains the base pins.

The top rib engages the base rib in the U-shaped portion thereof while each pin aperture receives a pin. Appropriate treatment welds the base to the top and removes the protruding portion of the pins.

With the pins and the apertures, the sonic weld problem is solved. Securing together by the sonic weld or other suitable manner, the shoulder of the base, combined with top rib and the base rib locking together supports the board within the container and form a strong container. There are outside buttresses on the container below the pin rib to add strength to the container. These buttresses also are notched to receive the top rib to provide for stacking of the container.

The top includes inside top long fingers and inside top short fingers. The inside long fingers are at the closed end of the container for stabilizing the board in an upward and downward position. The inside short fingers are adjacent to the open end of the container and assist in holding the end plate of the board in the container. Each top long finger is generally a flat, right-angle trapezoidal solid. Each top short finger is generally an inclined plane or triangular solid. The inside top long fingers and inside top short fingers combine with the clip to achieve the desired results.

Within the lower part of the base are end support platforms (or ribs) for supporting the end of the board and interior support platforms (or ribs) for supporting the base of the board. Adjacent the end of the container is a cap support for raising the board as required due to the presence of the cap on the board.

With this stackability and support mechanism, great advantages are achieved. The exterior side buttresses also in addition to making the container stackable render it stable and crush proof. This buttressing support also strengthens the container.

Adjacent the end of the container in the bottom thereof is a latch which may be on one or both sides at the open end. The fingers present in the top may be on the side but are preferred in the shown location at the end of the top. The side notch eliminates the side to side moving and supports the board within the container. The superior strength of the container provides for additional safety for the board.

Whether a support for the board in the container is a trapezoidal solid, a triangular solid or other angled device, with the low point of the support toward the open end, insertion of the board into the container is assisted. Such a structure provides an upward slope and guide facilitating insertion of the integrated circuit board therein.

Figure 1:
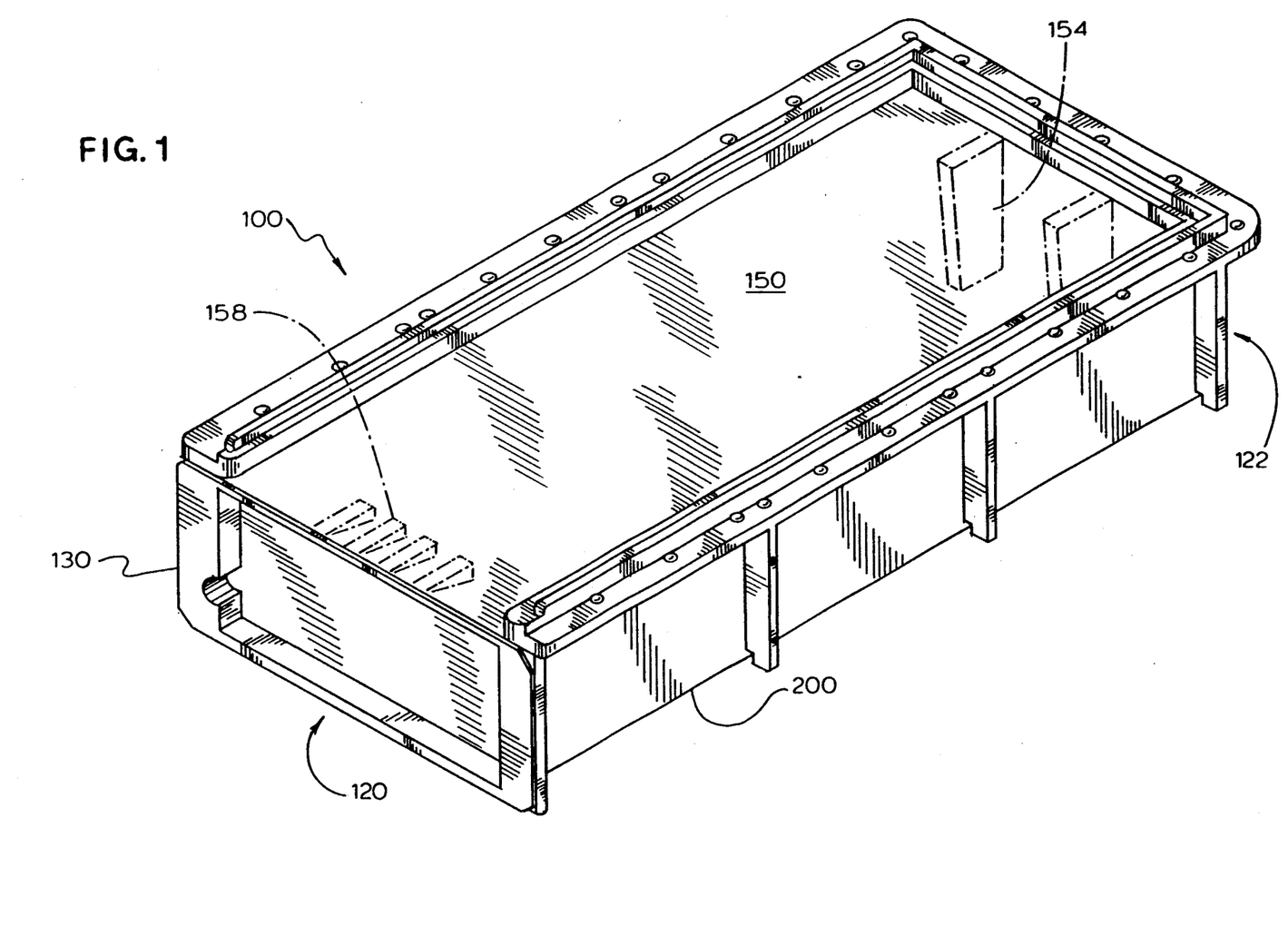
FIG. 1 depicts a perspective view of container 100 of this invention from open end 120, showing base 200 and top 150 with cap 130 in place.

Referring now to FIG. 1, a container 100 for an integrated circuit board 110 is an open-ended rectangular box, which can receive therein an integrated circuit board 110 (FIG. 2), especially of the type desired to be used by a telephone company. A manufacturer of this integrated circuit board 110 may also use this container 100 for storage, shipment or another suitable use. Other industries may have the same or additional uses for the container 100.

Container 100 is basically an open-ended, hollow rectangular box. Top 150 forms a top closure for container 100 and usually a larger side of the open-ended rectangular box. Base 200 provides four sides of the open-ended rectangular box. Base 200 cooperates with top 150 to complete the open-ended rectangular box but for open end 120 thereof.

Open end 120 is usually one of the small ends of the open-ended rectangular box. Cap 130 can serve to removably close open end 120. Both base 200 and top 150 include various protrusions therefrom to support integrated circuit board 110 therein. In this fashion, container 100 can protect integrated circuit board 110 in storage, transportation or other situation.

Cap 130 can serve to removably close open end 120. Both base 200 and top 150 include various protrusions therefrom to support integrated circuit board 110 therein. In this fashion, container 100 can protect integrated circuit board 110 in storage, transportation or other situation.

As shown, cap 130 has a substantially indented, flat central cap portion 132 with raised cap flanges 134 protruding therefrom. Flat central cap portion 132 fits inside container 100 with raised cap flanges 134 contacting base flanges 190. A side wall notch 136 connects with flat central cap portion 132 and cap flanges 134. Side wall notch 136 fits into locking slot 126.

Figure 2:
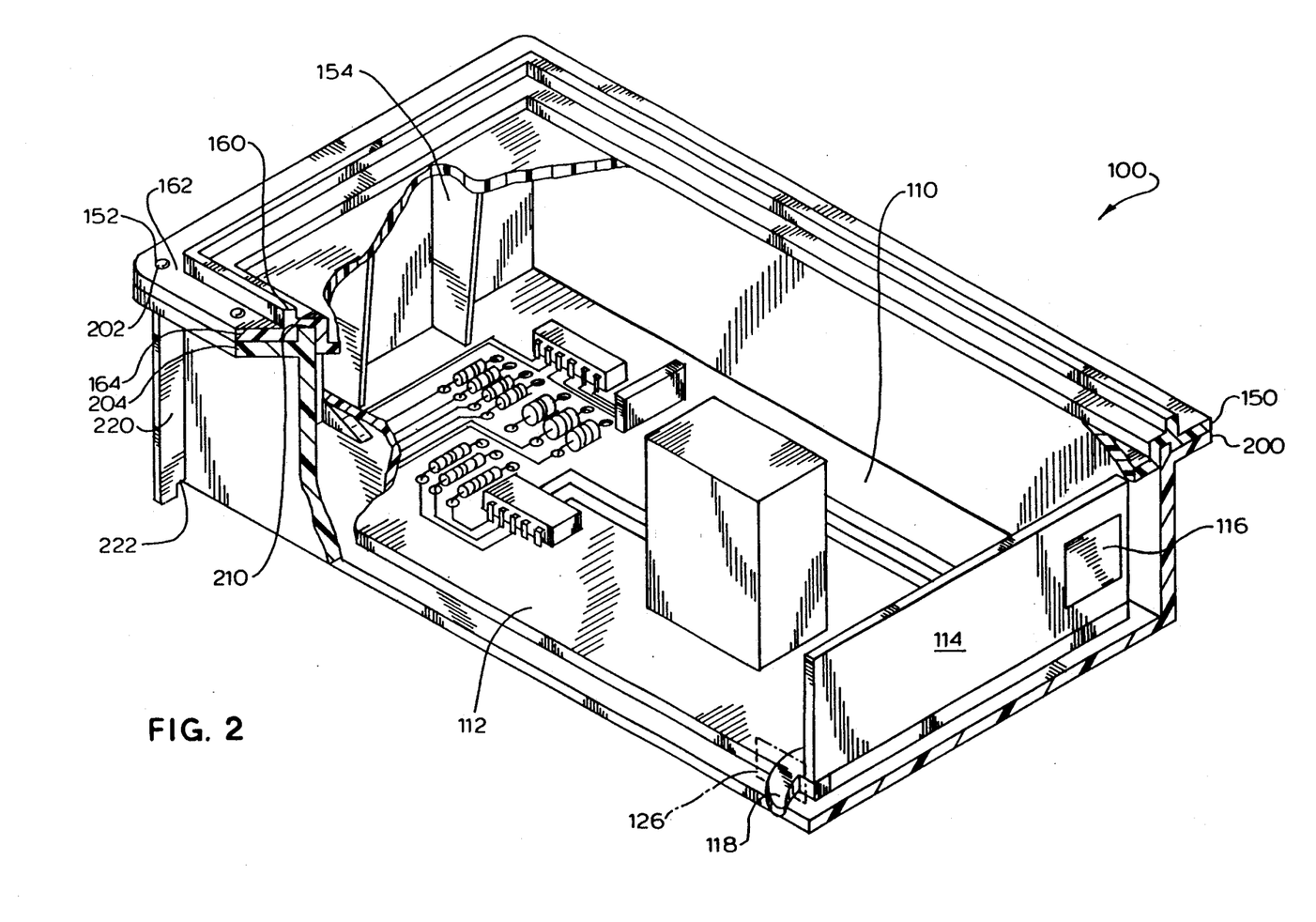
FIG. 2 depicts a perspective view of container 100 of this invention shown as partially cut away, with integrated circuit board 110 therein.

By adding FIG. 2 to the consideration, the particular structure of the container 100 is shown to be adaptable for the various sizes of circuit board 110. A mold or other manufacturing device for container 100 can be easily adjusted or otherwise structured to make the various sizes of container 100. As above described, the telephone company board 110 has a circuit platform 112 and an end piece 114 perpendicular thereto. The end piece 114 generally contains a coding mechanism 116 for telling the installer or user, what kind of board 110 it is in a quick and efficient manner.

The open ended rectangular container 100 described herein includes sufficient protection for the board 110 while at the same time providing a receiver in the form of locking slot 126. Locking slot 126 receives a standard locking mechanism 118 on the board 110 to hold the board 110 in the container 100. The end piece 114 provides protection for the board 110 from that end. The integration of the end piece 114 with the container 100, achieves the desired protection due to the resulting closed, hollow, generally rectangular container 100.

Figure 3:
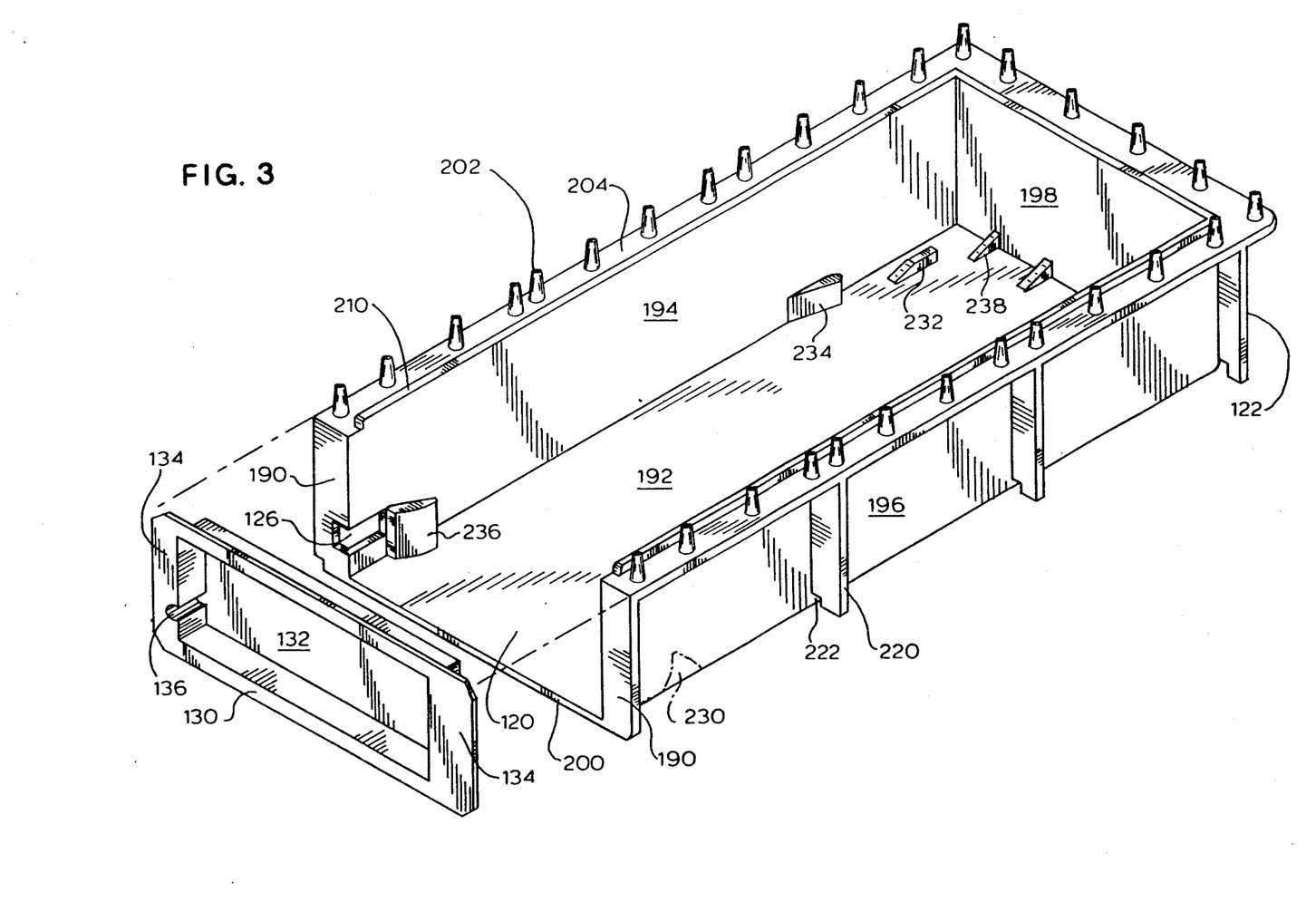
FIG. 3 depicts a perspective, exploded view of the base 200 for container 100 with cap 130 removed but present, and top 150 removed.

In FIG. 3, it becomes even more clear that a stable and stackable crush proof container 100 for holding an integrated circuit board 110 can be achieved. Basically, the container 100 includes the base 200 and the top 150 which are welded or otherwise secured together. The preferred welding is sonic welding.

Base 200, in forming four sides of container 100, generally includes a pair of base flanges 190, a lower platform 192, a first side platform 194, a second side platform 196, and an end platform 198. Lower platform 192 is generally oppositely disposed from top 150. End platform 198 is generally oppositely disposed from cap 130. First side platform 194 is oppositely disposed from and preferably parallel to second side platform 196. Flanges 190 are adjacent cap 130, when cap 130 is in place, and perpendicular to first side platform 194.

Considering FIG. 3, FIG. 4, FIG. 5 and FIG. 6 together, the base structure becomes clear. The base 200 has a series of upwardly pointing pins 202 along the outer top edge 204 thereof, which are received by a series of pin apertures 152 (FIG. 7) in the top 150.

After the pins 202 are inserted through the apertures 152, a fusion is done to secure the top 150 to the base 200. With the pins 202 and the pin apertures 152 combined, the sonic welding or other securing of the top 150 and the base 200 is accomplished more efficiently. It may be seen (FIG. 1, FIG. 2, and FIG. 3) that a pin 202 protrudes through its mating pin aperture 152. After the sonic welding or other securing method, the protrusion is gone.

Considering FIG. 2, FIG. 7, FIG. 8 and FIG. 9 together, top 150 forms a side of the hollow rectangle that is container 100. Around the edge of the top 150 is a raised top rib 160 slightly interior of the top edge 162. The top rib 160 basically frames the exterior of the top 150 with a outside edge 164 having the pin apertures 152 for securing top 150 to base 200.

The top rib 160 has a U-shaped portion 161 (FIG. 9) to engage the base rib 210 at its underside while each pin aperture 152 receives a pin 202. Shoulder 204 of base 200 includes the pins 202. So the shoulder 204 and outside edge 164 abut with the base rib 210 locking with top rib 160, thereby combining together, in order to support the board 110 and in a strong container 200. The pins 202, the pin apertures 152, the U-shaped portion 161 and the base rib 210 comboine to facilitate the joining of top 150 to base 200 and the subsequent welding or otherwise securing together thereof.

Top 150 has a central portion 156 centrally located in a frame formed by top rib 160 and U-shaped portion 161. Top rib 160 extends slightly above and is parallel to U-shaped portion 161. Outside edge 164 is preferably substantially parallel central portion 156, but raised thereabove relative to base 200 (FIG. 9) to engage the top edge 204 of base 200.

Again considering FIG. 3, FIG. 4, FIG. 5 and FIG. 6, there are outside buttresses 220 on and substantially perpendicular to the side of base 200 below the shoulder 204. These buttresses 220 each include a base notch 222. Base notch 222 may receive a portion of the top rib 160 to provide for stacking of a plurality of container 100. With this stackability and support mechanism, great advantages are achieved.

Not only do outside buttresses 220 make container 100 stackable, they also add to protection characteristics for container 100 to render it stable and crush proof. This buttressing support greatly strengthens container 100. Buttresses 220 are preferably three in number on first side platform 194, and three in number on second side platform 196. Buttresses 220 are preferably two in number on end platform 198.

A cap 130 (FIG. 1) can then be used to close the open end 120 of the container 100 completely. The integrated circuit board 110 is thus more secure in the container 100. It is also possible to eliminate cap 130 if additional protection for end piece 114 is not needed.

Within the lower platform 192 of the base 200 at closed end 122 are end ribs 230 for supporting the end of the board 110 and interior ribs 232 for supporting the circuit platform 112 of the board 110. Adjacent the open end 120 of the container 100 on base 200 is a cap support 236 for raising or supporting the board 110 and restricting movement of board 110 otherwise permitted due to the position and size of circuit platform 112 relative to the end piece 114.

Figure 4:
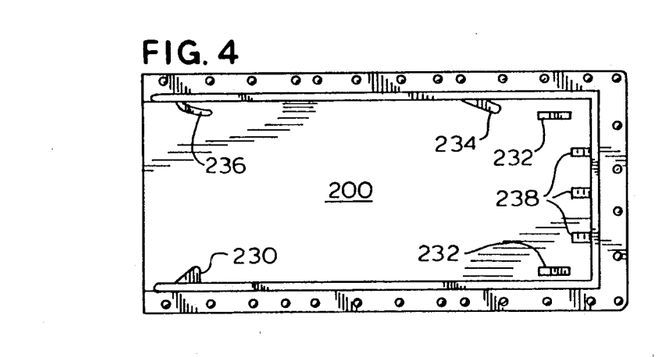
FIG. 4 depicts a top, plan view of base 200 for container 100.
Figure 5:
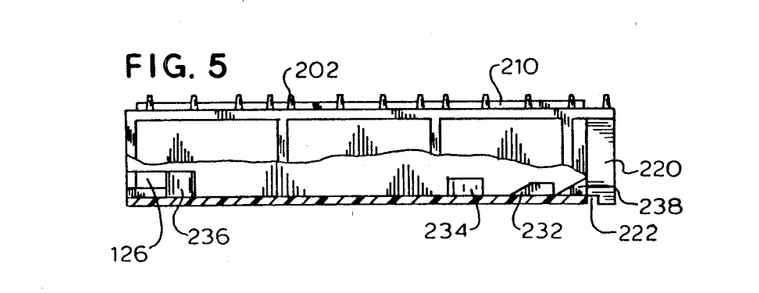
FIG. 5 depicts a side view of FIG. 4, with base 200 partially cut-away.
Figure 6:
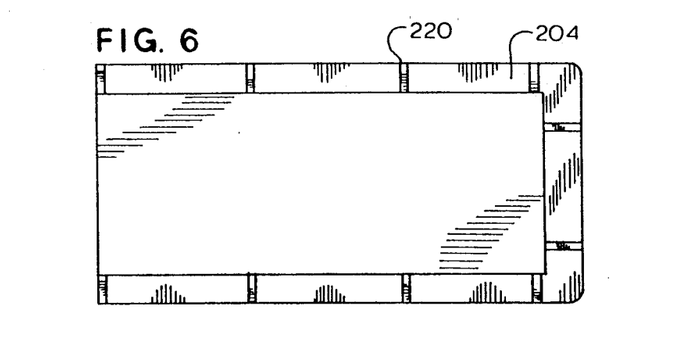
FIG. 6 depicts a bottom, plan view of base 200 for container 100.

Interior ribs 232 are preferably two in number and shaped like a right angle trapezoidal solid with the largest side of the trapezoidal solid on lower platform 192. Interior ribs 232 are near end platform 198 which forms closed end 122, with the angled side of interior ribs 232 toward open end 120.

Cap support 236 is adjacent latch receiver 126 and preferably situated on first side platform 194, although second side platform 196 is an option therefor if latch receiver 126 is also thereon. Secondary circuit board support 234 is similar in structure, position and function to cap support 236. The location of secondary circuit board support 234 is between cap support 236 and interior ribs 232.

At lower platform 192 and end platform 198 are end circuit platform supports 238. End circuit platform supports 238 are preferably three in number and shaped as a right triangular solid with the right angle at the juncture of lower platform 192 and end platform 198.

Adjacent the open end 120 of the container 100 in base 200 in the bottom is a latch receiver 126 to receive clip 118. Latch receiver 126 may be on one or both sides of base 200. The fingers 154 present in the top 150 may be on the sides of base 200, but are preferred in the shown location at the end of the top 150. The side notch 236 in base 200 eliminates the side to side movement and supports the board 110 within the container 100. The superior strength of the buttressed container 100 provides for additional safety for the board 110.

Referring back to FIG. 7, FIG. 8 and FIG. 9 together, top 150 includes inside fingers 154. The inside fingers 154 are at the permanently closed end 122 of container 100 thereof for stabilizing the board 110 in an vertical position. Closed end 122 is a smaller end of the hollow rectangular container 100 and is formed by one side of base 200. While inside fingers 154 may be of any suitable shape the preferred shape is that of a flat, right angle trapezoid with the largest base molded or otherwise secured to the top 150. The preferable number of inside fingers 154 is two, although other numbers are operable.

Figure 7:
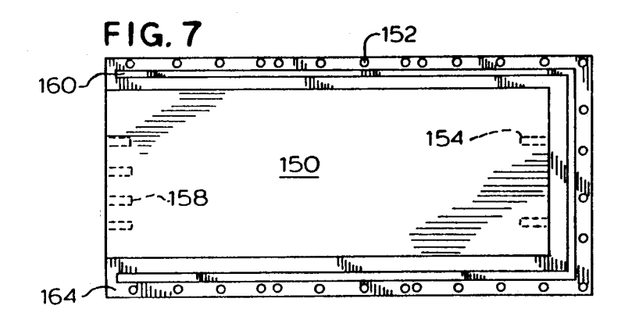
FIG. 7 depicts a top, plan view of top 150 for container 100.
Figure 8:
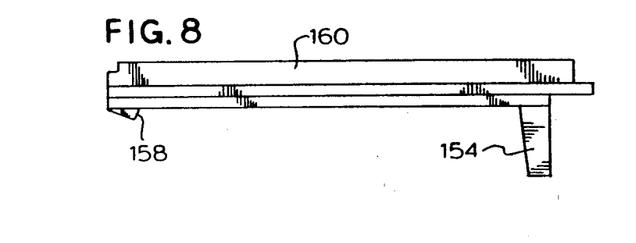
FIG. 8 depicts a side view of top 150 for container 100.
Figure 9:
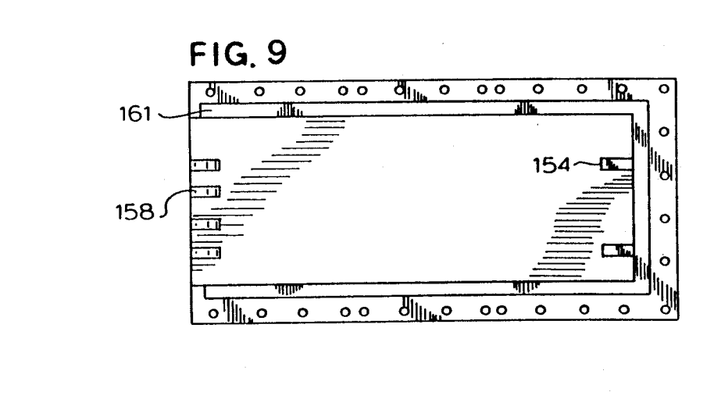
FIG. 9 depicts a bottom, plan view of top 150 for container 100.

At the open end 120 of the container 100, top 150 has a plurality of top flanges 158 for holding the end piece 114 of a circuit board 110 in position to seal open end 120. These top flanges 158 combined with the clip 118 on board 110 to achieve the desired results of minimal movement of board 100 in container 110. Top flanges 158 are shown as preferably four in number, but that number is flexible. Each top flange 158 is preferably in the shape of an inclined plane or a triangular solid.

Figure 10:
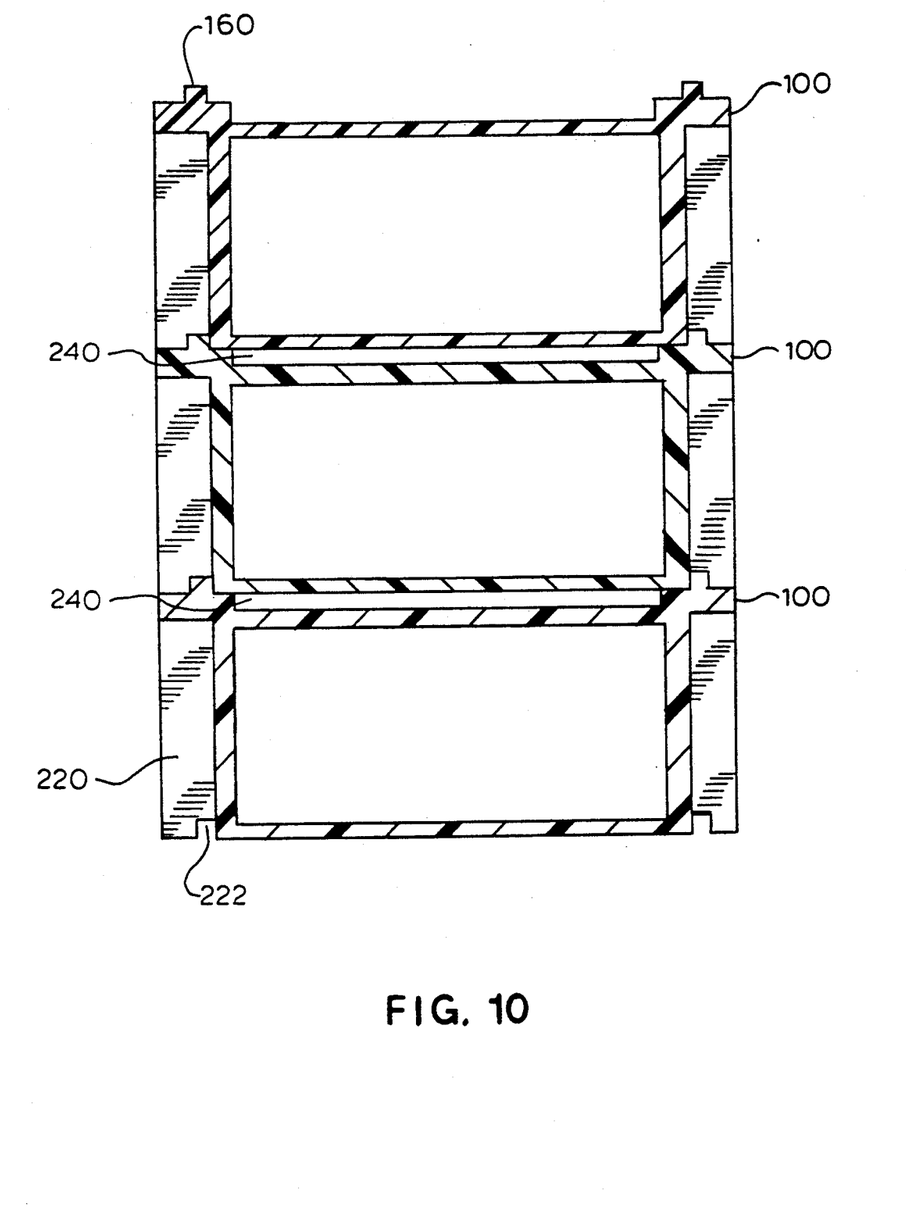
FIG. 10 depicts an end plan, partially cross-sectioned view of a stack of three of container 100 of this invention.
Figure 11:
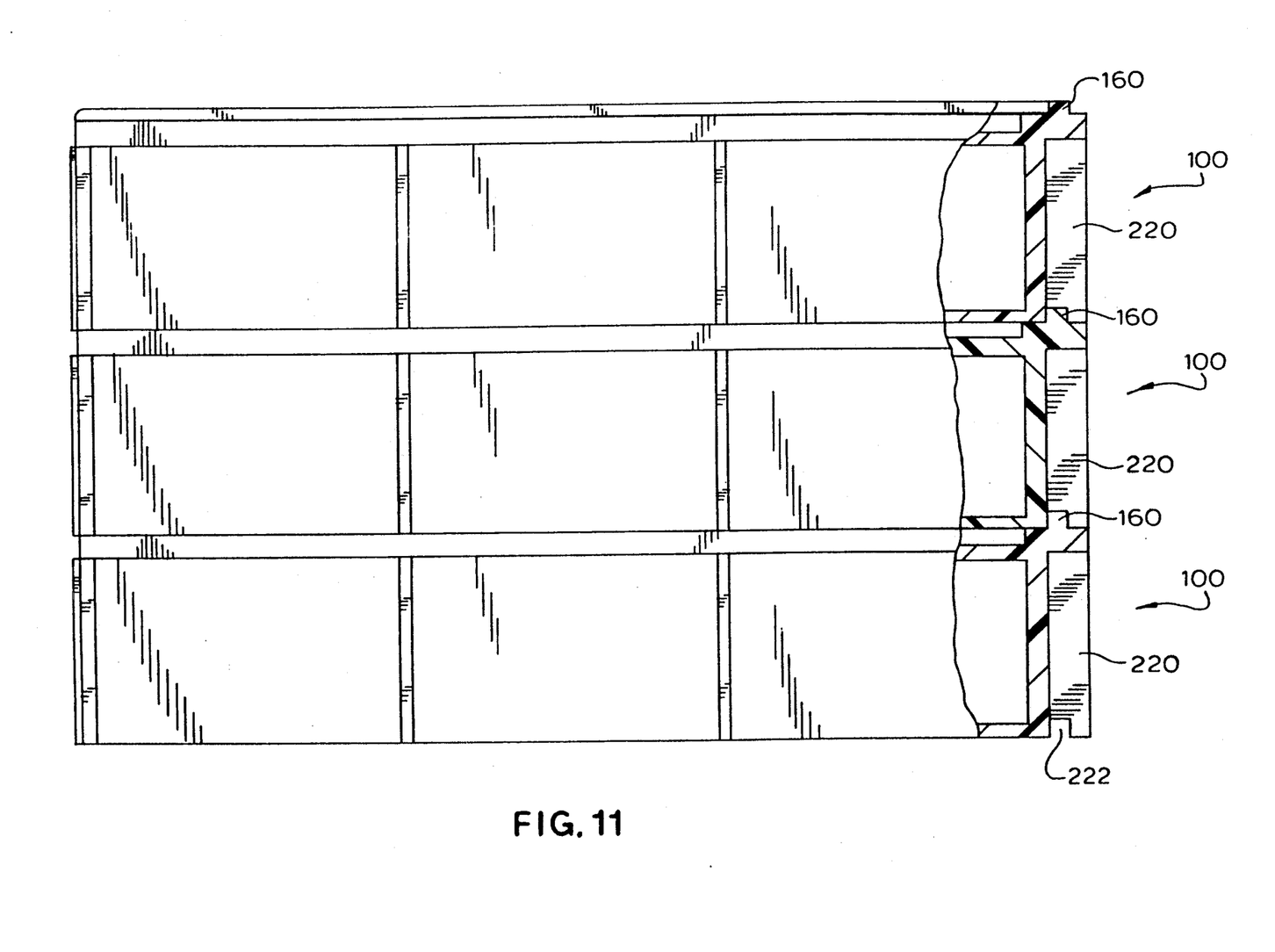
FIG. 11 depicts a side view of a stack of three of container 100 of this invention.

Referring now to FIG. 10 and FIG. 11, a stack of three of container 100 is depicted. Each buttress 220 includes a base notch 222. Base notch 222 receives a portion of the top rib 160 from top 150 to provide for stacking of a plurality of containers 100. This stackability and support mechanism provide stackability and protection for the board 110 contained therein. The top rib 160 cooperates with each base notch 222 and base flanges 190 to achieve this stackability.

Each base notch 222 is of sufficient size to permit a space 240 between central portion 156 of top 150 and the lower platform 192 when one container 100 is stacked with another container 100. Space 240 is framed by top rib 160 and is open at open end 120. Into space 240 may be inserted papers, shipping invoices or other flat items if desired. Space 240 thus simplifies transport of the necessary shipping paperwork.

Clearly the number of three containers 100 is for example only. Any reasonable number of containers 100 may stacked and stored, in a substantially vertical fashion. This structure also adds to protection characteristics for container 100 to render it stable and crush proof. These factors are highly important for storage and transportation reasons.

This application—taken as a whole with the specification, claims, abstract, and drawings—provides sufficient information for a person having ordinary skill in the art to practice the invention disclosed and claimed herein. Any measures necessary to practice this invention are well within the skill of a person having ordinary skill in this art after that person has made a careful study of this disclosure.

Because of this disclosure and solely because of this disclosure, modification of this method and apparatus can become clear to a person having ordinary skill in this particular art. Such modifications are clearly covered by this disclosure.

What is claimed and sought to be protected by Letters Patent of the United States is:

1. A container for an integrated circuit board capable of physically and electrostatically protecting the integrated circuit board, wherein:
   (a) the container comprises a hollow rectangular shape;
   (b) a plurality of supports for an integrated circuit board combine to maintain a chosen position of an integrated circuit board within the container;
   (c) the container has a base and a top the base provides four sides of the container and the top provides a fifth side of the container;
   (d) the base and the top combine to form the hollow, rectangular shape with an open end;
   (e) the container includes a closing means for closing said open end;
   (f) the container is formed of a material, which is substantially crushproof;
   (g) the material of the container additionally is substantially electrostatic resistant;
   (h) the four sides of the base include a bottom side, an end side, a first side and a second side;
   (i) the first side is substantially parallel to the second side;
   (j) the bottom side is substantially perpendicular to the end side, the first side and the second side;
   (k) the end side is substantially perpendicular to the first side and the second side;
   (l) the base has a flat base ledge around the free edges of three of the four sides of the base; and
   (m) the flat base ledge includes a base rib framing the flat base ledge of the base.

2. The container of claim 1, wherein:
   the top has a base contact side within the hollow rectangular shape, and a viewable side oppositely disposed from the base contact side and outside the hollow rectangular shape;
   the top has a flat top ledge around a perimeter of the top;

the top has a raised top rib on the viewable side; and
the top has a U-shaped channel on the base contact side.

3. The container of claim 2, wherein:
the flat base ledge contacts the flat top ledge; and
the U-shaped channel receives the flat base ledge.

4. The container of claim 3, wherein:
the flat base ledge includes at least one base pin; and
the flat top ledge has at least one base pin aperture to receive the at least one base pin.

5. The container of claim 3, wherein:
the flat base ledge extends outwardly from and substantially perpendicular to the end side, the first side and the second side.

6. The container of claim 5, wherein:
the top includes inside top long fingers on the base contact side within the container and inside top short fingers on the base contact side;
the top long fingers are adjacent the end side to hold an integrated circuit board; and
the top short fingers are adjacent the open end and hold the closing means and an integrated circuit board in the container.

7. The container of claim 6, wherein:
each of the top long fingers is shaped as a flat, right-angle trapezoidal solid; and
each of the top short fingers is shaped as an inclined plane.

8. The container of claim 6, wherein:
at least one buttress is present on the first side of the base;
at least one buttress is present on the second side of the base;
at least one buttress is present on the end side of the base;
each buttress is a substantially flat piece of material perpendicular to the base; and
each buttress includes a mating device to join the top and provide for stacking plural ones of the container with the bottom side of the base adjacent to the viewable side of the top.

9. The container of claim 6, wherein:
the bottom side of the base includes at least one end support platform to receive an end of an integrated circuit board;
each at least one end support platform is situated adjacent to the end side within the container;
each at least one end support platform serves to restrict movement of an end of an integrated circuit board;
the bottom side of the base includes at least one interior support platform;
each at least one interior support platform is adjacent the open end; and
a latch is within the first side to cooperate with an integrated circuit board and is adjacent the open end to provide a means to hold an integrated circuit board in the container.

10. The container of claim 9, wherein:
each top long finger is generally a flat, right-angle trapezoidal solid; and
each top short finger is generally an inclined plane.

11. The container of claim 10, wherein:
at least one buttress is present on the first side of the base;
at least one buttress is present on the second side of the base;
at least one buttress is present on the end side of the base;
each at least one buttress is a substantially flat piece of material perpendicular to the base; and
each at least one buttress includes a mating device to join the top and provide for stacking plural ones of the container with the bottom side of the base adjacent to the viewable side of the top.

12. The container of claim 11, wherein:
the flat base ledge contacts the flat top ledge;
the U-shaped channel receives the flat base ledge;
the flat base ledge includes at least one base pin; and
the flat top ledge has at least one base pin aperture to receive each at least one base pin;
the flat base ledge extends outwardly from and substantially perpendicular to the end side, the first side and the second side.

13. The container of claim 12, wherein the closing means is a cap, capable of sealing the open end of the container.

14. The container of claim 13, wherein the cap cooperates with the top short fingers to seal the open end of the container.

15. A combination including a container and an integrated circuit board, the container being capable of physically and electrostatically protecting the integrated circuit board, wherein:
the container comprises a hollow rectangular shape;
a plurality of supports for the integrated circuit board combine to maintain a chosen position of the integrated circuit board within the container;
the container has a base and a top;
the base and the top combine to form a hollow, substantially rectangular shape with an open end;
the base includes a bottom side, an end side, a first side and a second side;
the integrated circuit board includes a means to close the container after its insertion therein;
the container is formed of a material, which is substantially crushproof;
the material of the container additionally is substantially electrostatic resistant;
the plurality of supports include bottom side means, end side means, first side means, second side means, and top side means, all for supporting the integrated circuit board in the container;
a removable cap is mountable on the open end to close the container with the integrated circuit board contained therein;
the first side is substantially parallel to the second side;
the bottom side is substantially perpendicualar to the end side, the first side and the second side;
the end side is substantially perpendicular to the first side and the second side; and
a flat base ledge extends outwardly from and substantially perpendicular to the end side, the first side and the second side.

16. The combination of claim 15, wherein:
the top side means includes inside top long fingers and inside top short fingers;
the long fingers are adjacent the end side to hold the integrated circuit board;
the top short fingers cooperate with the cap and the integrated circuit board in the container;
the top long finger is shaped as a flat, right-angle trapezoidal solid;
the top short finger is shaped as an inclined plane;

at least one buttress is present on the first side of the base;

at least one buttress is present on the second side of the base;

at least one buttress is present on the end side of the base;

each buttress is a substantially flat piece of material perpendicular to the side;

each buttress includes a mating device to join the top and provide for stacking a plurality of the container with the bottom side of the base adjacent to the viewable side of the top;

the bottom side means includes at least one end support platform supporting an end of the board;

each at least one end support platform is situated adjacent to the end side within the container;

each at least one end support platform serves to restrict movement of an end of the board;

the bottom side of the base includes at least one interior support platform;

each at least one interior support platform is adjacent the open end;

a latch is movably secured within the first side to cooperate with the integrated circuit board and is adjacent the open end to provide a means to hold the integrated circuit board in the container;

each of the top long fingers has a shape of a flat, right-angle trapezoidal solid; and each of the top short fingers has a shape of an inclined plane.

17. A method for forming a container for an integrated circuit board capable of physically and electrostatically protecting the integrated circuit board, wherein:

providing a base and a top for a container;

shaping the top to have a substantially flat shape with a top perimeter, a base contact side and a viewable side;

forming a flat top ledge around the perimeter of the top;

forming a raised top rib on the viewable side;

forming a U-shaped channel on the base contact side to frame the base contact side;

forming at least one aperture in the flat top ledge;

forming the base to provide four sides of the container;

the four sides of the base include a bottom side, an end side, a first side and a second side;

the first side is substantially parallel to the second side;

the bottom side is substantially perpendicular to the end side, the first side and the second side;

the end side is substantially perpendicular to the first side and the second side;

having the top provide a fifth side of the container;

providing a flat base ledge around the base around the free edges of three of the four sides;

providing a base rib to frame the flat base ledge of the base;

providing the flat base ledge with at least one base pin;

joining the base to the top;

mating the U-shaped channel to the base rib to frame the flat base ledge of the base;

mating each at least one aperture with each at least one base pin; and securing the top to the base.

18. The method of claim 17, wherein a sonic welding step provides the securing of the top to the base.

* * * * *